United States Patent [19]

Burbank et al.

[11] 4,393,349

[45] Jul. 12, 1983

[54] ASYMMETRICAL SQUID

[75] Inventors: Max B. Burbank, Maple Ridge; Randy K. Lomnes; Jiri Vrba, both of Port Coquitlam; Alistair A. Fife, Coquitlam, all of Canada

[73] Assignee: Her Majesty the Queen in right of Canada, as represented by the Minister of National Defence, Ottawa, Canada

[21] Appl. No.: 151,815

[22] Filed: May 21, 1980

[30] Foreign Application Priority Data

Jul. 26, 1979 [CA] Canada .................................. 332608

[51] Int. Cl.³ ........................ G01R 33/02; H03K 3/38
[52] U.S. Cl. .................................... 324/248; 307/306
[58] Field of Search ........................ 324/248; 291/599; 307/306; 335/216; 336/DIG. 1

[56] References Cited

U.S. PATENT DOCUMENTS 4,064,029 12/1977 Wu et al. ............................. 324/248

OTHER PUBLICATIONS

Jackel et al., "Noise in the rf SQUID", May 1975, Jour. of Low Temp. Physics, vol. 19, No. 3-4, pp. 226-235.
Zimmerman, "Squid Instruments...", Jour. of Applied Physics, vol. 48, No. 2, Feb. 1977, pp. 702-710.

Primary Examiner—Gerard R. Strecker
Assistant Examiner—Walter E. Snow
Attorney, Agent, or Firm—William R. Hinds

[57] ABSTRACT

The present invention relates to a SQUID device for magnetic field measurement. The device is comprised of a body of superconducting material. First and second holes are located therein. A slot is provided joining the first and second holes. A contact unit is provided which is located in the slot thereby forming a weak link across the slot. The dimensions of the first and second holes produce first and second inductances respectively. These inductances have unequal magnitude.

4 Claims, 6 Drawing Figures

ASYMMETRICAL SQUID

The present invention relates to an asymmetrical SQUID.

Single hole and symmetrical, double-hole SQUIDS are known.

However, commonly used symmetrical, double-hole SQUIDS exhibit inherent drawbacks when used to measure external magnetic fields or field gradients where high sensitivity and resolution are required.

A SQUID device produces an output current or voltage which is a function of the intensity of the magnetic field to which it is subjected. The current circulating in the SQUID increases monotonically as the field being measured increases, until some critical current value is reached. The magnitude of the critical current value is determined by the physical parameters of the SQUID with respect to size, shape and material. When this critical current is reached, the weak link in the SQUID stops superconducting and the current in the weak link drops and begins to build up once again as the fluid continues to increase. The periodic behaviour of the SQUID ring current with the magnetic field can be exploited in many ways. One common method of its practical utilization is r.f. biasing the SQUID and converting the variations of the magnetic field into variations of the r.f. voltage. The output of the SQUID is a series of triangular voltage waveforms. By counting the number of triangular waveforms, it is possible to determine the number of flux transitions which the SQUID has undergone. Since a particular increase or decrease in the magnetic field to be measured generates a certain number of flux transitions, it is possible to determine the quantum increase or decrease in magnetic field. By measuring the amplitude of the signal in the triangular waveform of the last transition, and by adding this to the "quantum" count, it is possible to determine the exact change in magnetic field being measured.

It can therefore be seen that if the amplitude of the triangular output signal is increased for a given flux transition, the sensitivity of the field measurement can be increased. It has been found that by employing an asymmetrical, double-hole SQUID, the amplitude of the triangular waveform can be increased without increasing the noise in the system. As a result, better sensitivity and an improved signal-to-noise ratio can be achieved by using an asymmetrical SQUID.

The ability of the SQUID to detect rapid changes in magnetic field is known as the slew rate. The slew rate of the SQUID system is determined by the ratio of the voltage triangle amplitude to the noise in the SQUID. By increasing the voltage triangle amplitude, the slew rate of the SQUID system is also increased.

The period of the triangular waveform is also beneficially affected by the asymmetrical SQUID. By virtue of the SQUID asymmetry the periodicity of the voltage triangles is reduced and consequently the resolution of the external magnetic field is increased.

SUMMARY OF THE INVENTION

In accordance with one aspect of the invention there is provided a SQUID device for magnetic field measurements consisting of two superconducting inductances, said inductances being connected in parallel with a weak link, said inductances having unequal magnitudes.

In accordance with another aspect of the invention there is provided a SQUID device for magnetic field measurements comprising a body of superconducting material; first and second holes located therein; a slot joining said first and second holes; a weak link located within said slot; wherein the dimensions of said first and second holes create first and second inductances respectively which are of unequal magnitudes. It is therefore an object of the present invention to provide a SQUID system which is capable of providing a measure of applied magnetic field with increased sensitivity.

It is another object of the present invention to provide a SQUID which has an improved slew rate.

It is yet another object of the present invention to provide a SQUID system having an improved signal-to-noise ratio.

INTRODUCTION TO THE DRAWINGS

The present invention will be described by way of embodiments, in detail hereinbelow with the aid of the accompanying drawings, in which.

DETAILED DESCRIPTION

Figure 1:
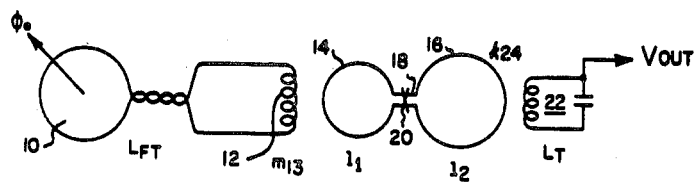
FIG. 1 is a schematic diagram of an asymmetrical SQUID used in a system for detecting the value of a magnetic field.

With reference to FIG. 1, a pickup loop 10 for detecting a magnetic flux $\phi_0$ is connected to a flux transformer coil 12 having an overall inductance $L_{FT}$. The pickup loop may have any configuration desired, e.g. a magnetometer, a gradiometer, a second order gradiometer, etc., or the coil 12 may be connected to any required circuit. The magnetometer loop 10 in FIG. 1 is selected for illustration purposes only. The coil 12 is coupled to a first hole 14 in the SQUID. This hole has an inductance $l_1$. The first hole 14 is connected to a second hole 16 by a slot 18 bridged by a weak link 20. A contact point shown in many of the embodiments hereinbelow, is one specific type of weak link. Hole 16 has an inductance $l_2$. A tank circuit coil 22 is coupled to the second hole 16.

The voltage output $V_{asym}$ of the triangular waveform can be written as a function of the circuit shown in FIG. 1 as follows:

$$V_{asym} = \frac{\omega \phi_0 \sqrt{L_T}}{2 k_{24}} \left( \frac{1}{\sqrt{l_2}} + \frac{\sqrt{l_2}}{l_1} \right) \text{ or} \quad (1)$$

$$V_{asym} = B \left( \frac{1}{\sqrt{l_2}} + \frac{\sqrt{l_2}}{l_1} \right) \text{ where} \quad (2)$$

$$B = \frac{\omega \phi_0 \sqrt{L_T}}{2 k_{24}} \quad (3)$$

and where $\omega$ is the resonant frequency of the tank circuit, $\phi_0$ is the flux quantum, and $k_{24}$ is the coupling coefficient between $l_2$ and $L_T$.

For a symmetrical, double-hole SQUID, since the two holes are of equal size and therefore of equal inductance, the equation simplifies as follows:

$$V_{sym} = B\left(\frac{1}{\sqrt{l_2}} + \frac{1}{\sqrt{l_2}}\right) = \frac{2B}{\sqrt{l_1}} \qquad (4)$$

The gain G of the asymmetrical Squid can then be defined as:

$$G = \frac{V_{asym}}{V_{sym}} = \frac{1}{2}\left(\sqrt{\frac{l_1}{l_2}} + \sqrt{\frac{l_2}{l_1}}\right) \qquad (5)$$

The performance of the SQUID sensor may be evaluated using the parameter $R_F$ which is closely associated with the SQUID resolution. The parameter $R_F$ is defined as the ratio of the voltage triangle height to the flux periodicity. The parameter $R_F$ may be increased by the SQUID asymmetry and consequently SQUID resolution and system slew rate are increased. The parameter $R_F$ may be written as:

$$R_F = \frac{\omega\sqrt{L_T}\, m_{13}}{k_{24} L_{FT}} \cdot \frac{\sqrt{l_2}}{l_1} \text{ or} \qquad (6)$$

$$R_{F\,asym} = C\frac{\sqrt{l_2}}{l_1} \text{ where} \qquad (7)$$

$$C = \frac{\omega\sqrt{L_T}\, m_{13}}{k_{24} L_{FT}} \qquad (8)$$

where $\omega$ is the resonant frequency of the tank circuit, and $m_{13}$ is the mutual inductance between $L_{FT}$ and $l_1$. Let us assume that the SQUID asymmetry is varied by the manipulation of the inductance $l_1$. Then, if the inductance $l_1$ equals the inductance $l_2$, i.e. the case of a symmetrical, double-hole SQUID then:

$$R_{F\,sym} = \frac{C}{\sqrt{l_1}} \qquad (9)$$

The ratio of $R_{F\,asym}$ and $R_{F\,sym}$ is an indication of the improvement of the SQUID resolution and is:

$$\frac{R_{F\,asym}}{R_{F\,sym}} = \sqrt{\frac{l_2}{l_1}} \qquad (10)$$

As an example, if $l_1 = 1/9\, l_2$, i.e. the sizes of the holes are such that the inductance of hole 14 is 1/9 the inductance of hole 16, then $G = 5/3$ and the ratio $R_{F\,asym}/R_{F\,sym} = 3$.

The flux periodicity of the SQUID sensor also depends on its asymmetry. It can be shown that if the asymmetry is manipulated by changing the tank circuit hole 16 in FIG. 1, then the ratio of the flux periodicity $\delta\phi$ of asymmetric and symmetric SQUIDS is approximately given by:

$$\frac{\delta\phi_{asym}}{\delta\phi_{sym}} = \frac{1}{2}\left(1 + \frac{l_1}{l_2}\right) \qquad (11)$$

Then if $l_1 = 1/9\, l_2$, the period of the asymmetrical SQUID is equal to 5/9 or approximately one-half of the period of the symmetrical SQUID.

Figure 2:
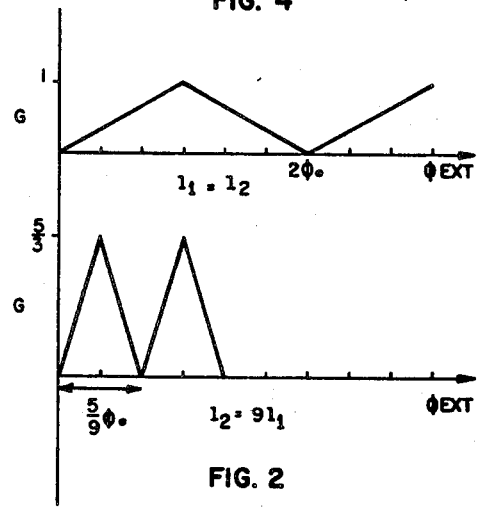
FIG. 2 is a graph used in the explanation of FIG. 1.

FIG. 2 is a normalized plot of the triangular waveform of a symmetrical SQUID, i.e. $l_1 = l_2$ in comparison to an asymmetrical SQUID $l_1 = 1/9\, l_2$. It can be seen that both the gain and the period are much improved with respect to the symmetrical, double-hole SQUID.

Figure 3:
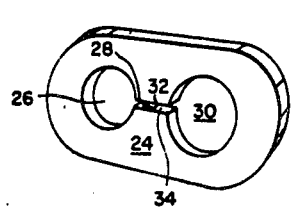
FIGS. 3, 4, 5 and 6 are embodiments of the asymmetrical SQUID according to the present invention.

FIG. 3 illustrates one embodiment of an asymmetrical, double-hole SQUID. The SQUID consists of a body 24 of superconducting material such as niobium. The thickness of the body is not critical but must be considered when determining the inductances of the holes.

One embodiment contemplated has the superconducting material taking the form of a thin film adhered to a substrate. A first hole 26 is connected by a slot 28 to a second hole 30. A weak link 32 is provided in slot 28 as for example a contact point touching the lower edge 34 of the slot. If the SQUID is constructed as a thin film, then the weak link is made by depositing an extremely thin bridge across the slot 28.

The two SQUID inductances are represented by two holes in the SQUID body. The holes are connected by a narrow slot. The asymmetry of the SQUID is controlled by the diameter of the holes and the exact positioning of the weak link.

Hole 30 is larger than hole 26 and would be used to couple the tuned circuit to the SQUID when detecting magnetic field or magnetic field gradient in accordance with the embodiment shown in FIG. 1.

Figure 4:
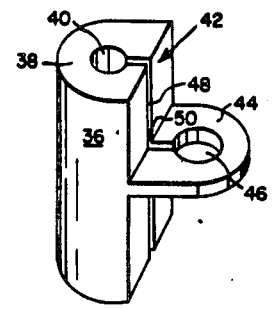

FIG. 4 is another embodiment of the asymmetrical SQUID in accordance with the present invention. The SQUID consists of a body 36. The body has a first tubular region 38 containing a first SQUID hole 40. The tubular region is longitudinally truncated to form a flat face 42. The second region 44 is formed on the flat face. The second region contains a second SQUID hole 46, larger than the first. The dimensions of the two SQUID holes with respect to both diameter and length are such that the inductance of hole 46 is greater than hole 40. The greater surface area of hole 40 provides greater coupling with, for example, a flux transformer as shown at 12 in FIG. 1. The two holes are connected by a slot 48 containing a weak link 50. The material of the SQUID 36 must be superconducting.

Figure 5:
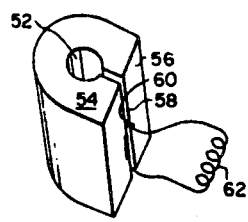

FIG. 5 is a hybrid embodiment of the present invention. A hole 52 is located in a tubular body 54. The body is longitudinally truncated to form a flat surface 56. A slot 58 is cut from hole 52 to the face 56 and a weak link 60 is formed bridging slot 58. A coil of superconducting wire 62 is welded onto the flat surface 56 directly adjacent the slot 58 and constitutes the inductance $l_2$ replacing the second hole as shown in the other embodiments. This embodiment provides a convenient way of increasing the inductance $l_2$.

Figure 6:
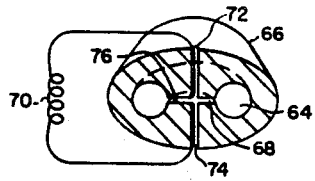

FIG. 6 is another hybrid embodiment of the present invention. A hole 64 in the form of a toroid is located in a body of superconducting material 66. The toroidal hole is cut through at its center by slot 68 and a weak link 76 is formed there. A coil of superconducting wire 70 is provided which replaces the second hole in other embodiments and provides the inductance $l_2$. The ends of coil 70 are welded to either side of the slot 68 in the toroid and exit the body through holes 72 and 74 made in the body. The weak link 76 is formed across slot 68 near the coil joints. Coupling from an external element can be made via holes 72 and 74 into the interior toroidal hole. Alternatively, a hole or holes may be provided joining the exterior of the body with the interior toroidal hole for coupling external elements.

We claim:

1. A SQUID device for magnetic field measurements comprising a tubular body of superconducting material, said body being truncated longitudinally to provide a flat surface; a hole having a longitudinal axis which is coaxial with the longitudinal axis of said body; a slot having a longitudinal axis parallel with said longitudinal axis of said body and joining said hole and said flat surface; a coil of superconducting wire having ends centrally affixed to said flat surface and directly adjacent said slot, wherein the inductance of said coil is different than the inductance of said hole; and wherein a weak link is located in said slot adjacent said flat surface.

2. A SQUID device for magnetic field measurements comprising a body of superconducting material; a toroidal cavity located within said body, a planar circular slot circumferentially joining the interior wall of said toroidal cavity; said slot having a weak link located therein; first and second holes located centrally in said body having longitudinal axes which are perpendicular to the plane of said planar slot; a coil of superconducting wire having ends which are connected through said first and second holes respectively, and affixed to the opening faces of said planar slot; wherein the inductance of said coil is different than the inductance of said toroidal cavity.

3. The device according to claims 1 or 2 wherein said superconducting material is niobium.

4. A SQUID device for magnetic field measurements comprising a body of superconducting material, said superconducting material being niobium; first and second holes located therein; a slot joining said first and second holes; a weak link located within said slot; the dimensions of said first and second holes creating first and second inductances respectively which are of unequal magnitudes; said body being divided into a first and a second region, said first region containing said first hole being tubular and being truncated longitudinally to form a flat surface, said second region extending centrally and perpendicularly from said flat surface and containing said second hole; and said slot being oriented longitudinally with respect to said first region.

* * * * *